United States Patent [19]

Pascucci

[11] Patent Number: 5,793,699

[45] Date of Patent: Aug. 11, 1998

[54] CIRCUIT FOR THE GENERATION AND RESET OF TIMING SIGNAL USED FOR READING A MEMORY DEVICE

[75] Inventor: Luigi Pascucci, Sesto San Giovanni, Italy

[73] Assignee: SGS-Thomson Microelectronics S.r.l., Agrate Brianza, Italy

[21] Appl. No.: 811,386

[22] Filed: Mar. 4, 1997

[51] Int. Cl.[6] .................................................. G11C 8/00
[52] U.S. Cl. ................................. 365/233.5; 365/206
[58] Field of Search ............................ 365/206, 233.5

[56] References Cited

U.S. PATENT DOCUMENTS

| | | | |
|---|---|---|---|
| 5,323,359 | 6/1994 | Kayamoto et al. | 365/233.5 |
| 5,418,479 | 5/1995 | Sambandan | 326/93 |
| 5,654,935 | 8/1997 | Hisada et al. | 365/233.5 |
| 5,657,269 | 8/1997 | Nanamiya | 365/185.17 |

Primary Examiner—David C. Nelms
Assistant Examiner—Hoai Ho
Attorney, Agent, or Firm—Wolf, Greenfield & Sacks, P.C.

[57] ABSTRACT

A circuit for generating and resetting timing signals used for reading a memory device, includes first detecting circuit means for detecting a state transition of address digital signals of the memory device, the detecting means being suitable of generating a start digital signal of a read operation represented by a digital pulse of a prescribed duration upon a state transition of at least one of said address signals, second circuit means activated by said start signal for generating a timing signal for the read operation of the memory device, and third circuit means driven by said start digital signal for generating resetting signals for said timing signals, and fourth circuit means for detecting than said start signal has a duration shorter that said prescribed duration and for determining a consequent extension of the duration of said start signal sufficient to assure the generation of said resetting signals.

29 Claims, 4 Drawing Sheets ively, the new address configuration could determine the change of both the previously-selected row and column of the memory cell array). In the drawing, the array of memory cells is not shown; however, it is intended to be a conventional bidimensional array architecture with rows and columns of memory cells.

5,793,699

1

CIRCUIT FOR THE GENERATION AND RESET OF TIMING SIGNAL USED FOR READING A MEMORY DEVICE

FIELD OF THE INVENTION

The present invention relates to an improved circuit for the generation and reset of timing signal used for governing the read operation of a memory device.

BACKGROUND OF THE INVENTION

One of the most important aspects in the design of modern integrated circuits is immunity to noise always existing in an electronic system wherein the integrated circuits are to be embedded. In the context of this application, by "noise" it is meant for example the variations of the supply and reference voltages which supply an integrated circuit mounted in a printed circuit board, with respect to the design values of such voltages.

When such noise exceeds tolerability thresholds of the integrated circuits, the latter cannot work correctly.

It is more probable that such tolerability thresholds are exceeded when the number of noise sources is high. For example, considering memory devices, with an increase in the number of output data lines from eight to sixteen to thirty-two, the noise generated during a read operation of the memory device by switching of each output data lines sum up, and the overall noise is exacerbated. An increase of the value of the reference voltage (ground) supplying the integrated circuit, as well as a decrease of the value of the voltage supply, can trigger in the memory device spurious read operations: the memory device behaves as if the address configuration changed. This is particularly undesirable in the case of memory devices designed to have an internal architecture providing for data sampling, wherein during a read operation the data existent at the output of the sensing circuits of the memory cell array are stored in bistable elements, at a prescribed time instant starting from the beginning of the read operation (i.e., from the change in the address configuration supplied to the memory device).

FIG. 1 schematically shows the circuit blocks which in a conventional memory device generate internal timing signals used for governing the read operations. Block 1 comprises circuits (per-se known and therefore not shown in detail) generating pulses suitable for detecting a change in the state of the address signals, grouped in bus ADD: for each address signal of bus ADD there is provided a respective circuit suitable for generating a pulse signal when such address signal changes its state. All these pulse signals are ORed together (NOR gate 6 and inverter 9) so that a pulse signal named ATD (Address Transition Detection) is produced when at least one of the address signals of bus ADD changes its state.

A read operation of the memory device starts when block 1 detects that at least one of the address signals of bus ADD has changed its state, and generates signal ATD. Signal ATD drives a block 2 controlling in turn a block 3, the latter comprising circuits for generating internal timing signals for governing all the phases of the read operation of the memory device; in the drawing, such timing signals are shown grouped together in a bus TS. Timing signals TS define, for example, the instant at which the addressed memory cells of the memory cell array are to be read (i.e., the instant at which the sensing circuits of the memory cell array are to be enabled), the presetting of proper reference levels, and so on. Signal ATD can thus be considered a trigger signal determining the start of a read operation. Signal ATD also drives a block 4 which, driving in turn block 3, resets timing signals TS.

2

FIG. 2 schematically shows the time evolution of the timing signals in the case of a read operation not affected by noise. At the activation of signal ATD (rising edge) the timing signals of bus TS are activated; simultaneously, decoding circuits of the state of the address signals ADD start to deselect a row WLa of the memory cell array previously selected, and to select a new row WLb of the memory cell array (it is for example supposed that the new address configuration involves a change of the memory array row; however, the new address configuration could as well involve a change of the column of memory cells of the array, the row being left unchanged; alternatively, the new address configuration could determine the change of both the previously-selected row and column of the memory cell array). In the drawing, the array of memory cells is not shown; however, it is intended to be a conventional bidimensional array architecture with rows and columns of memory cells.

At the deactivation of signal ATD (falling edge), block 4 determines the start of a ramp signal PR reproducing the time delay necessary for deselecting the previously-selected row WLa and selecting the currently-addressed row WLb. When signal PR reaches a prescribed threshold level S, set at a level suitable to assure that the previously-selected row WLa has been deselected and the new row WLb has been selected, block 4 commands block 3 to reset timing signals TS; resetting of timing signals TS determines, for example, the enabling of the sensing circuits of the memory cell array, and so on. Then, also signal PR returns to zero.

FIG. 3 shows the same situation of FIG. 2, but in the presence of noise on the supply voltages of the memory device. After the generation of an ATD pulse of normal width, and thus in a phase in which both timing signals TS and signal PR are activated, another ATD pulse is produced, but with a much narrower width; such an ATD pulse can, for example, be produced in consequence of the change of state of one of the address signals ADD, in the presence of noise on the supply or reference voltage of the integrated circuit; or, alternatively, such an ATD pulse could also be produced by noise itself, without any real change of the address signals. In both cases, the memory device starts the deselection of the row which was being selected, and the selection of a new row. The new ATD pulse tries to reset signal PR; however, since the width of the new ATD pulse is not sufficient, signal PR does not return completely to zero, and restarts from a higher voltage level; in consequence of this, threshold S is reached too quickly, and the duration of the timing signals TS, measured from the instant of generation of the new ATD pulse, is too short: signals TS are deactivated when the row of the memory cell array that was being selected has not been deselected completely, and the new row has not yet been fully selected. Since timing signals TS determine the time evolution of the read operation, the sensing circuits of the memory cell array will be activated when the new row has not been selected yet, the data existent at the output of the sensing circuits will be stored in bistable elements when the new row has not been completely selected, and there is the risk of storing erroneous data.

Similar problems occur when a spurious ATD pulse starts the selection of a new column of the memory array, and the timing signals TS are deactivated before the new column has been precharged at a suitable potential, or before the sensing circuits of the memory cell array have been correctly initialized.

From the previous description it appears that one of the more critical operations from the point of view of noise is

3 that of resetting the starting conditions in the circuits which generate the internal timing signals governing the read operation of the memory device. In the presence of noise, the reset signals which should assure the reset of the starting conditions are generally distorted (for example, they do not reach the desired voltage levels, or have a too short duration). It is thus not possible to assure that the starting conditions are really restored, and the operation of the memory device is not reliable.

SUMMARY OF THE INVENTION

In view of the state of the art described, it is an object of the present invention to provide an improved circuit for the generation and resetting of timing signals used for governing a read operation of a memory device, said circuit being immune from noise.

According to the present invention, such an object is attained by means of a circuit for generating and resetting timing signals used for reading a memory device, comprising detecting circuit means for detecting a change of state of address digital signals of the memory device, said detecting means being suitable for generating a start read operation digital signal represented by a digital pulse of a prescribed duration upon a state transition of at least one of said address digital signals, second circuit means activated by said start signal for generating timing signals for the read operation of the memory device, and third circuit means driven by said start signal for generating resetting signals for said timing signals, and fourth circuit means for detecting that said start signal has a duration shorter than said prescribed duration and for consequently determining an extension of the duration of said start signal sufficient to assure the generation of said resetting signals.

Thanks to the circuit of the invention, it is assured that, also in the presence of noise, the signals for resetting the timing signals are properly generated, so that also when a start signal with insufficient duration is generated, the correct timing of the read operation is assured.

DETAILED DESCRIPTION OF THE DRAWINGS

The features and advantages of the present invention will be made apparent by the following detailed description of some particular embodiments thereof, illustrated as non-limiting examples in the annexed drawings, wherein:

FIG. 1 schematically shows a circuit for the generation of timing signals for reading a memory device according to the prior art;

Figure 4:
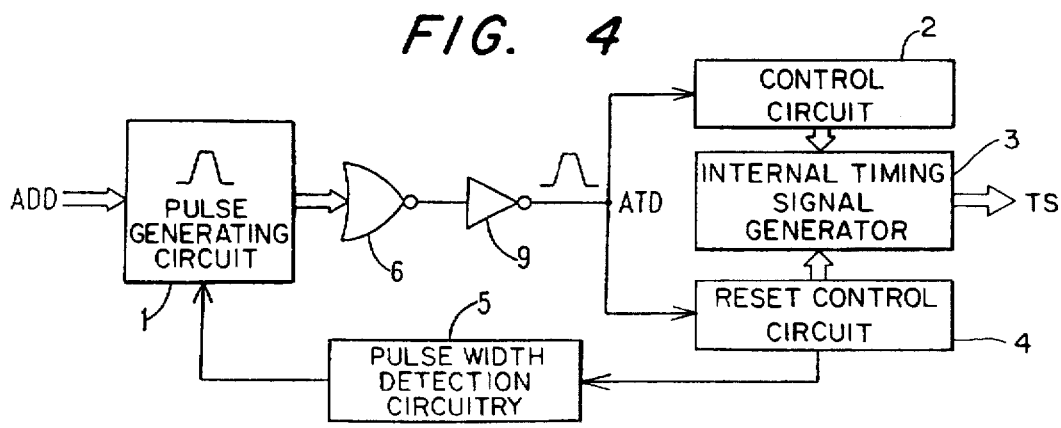
Figure 5:
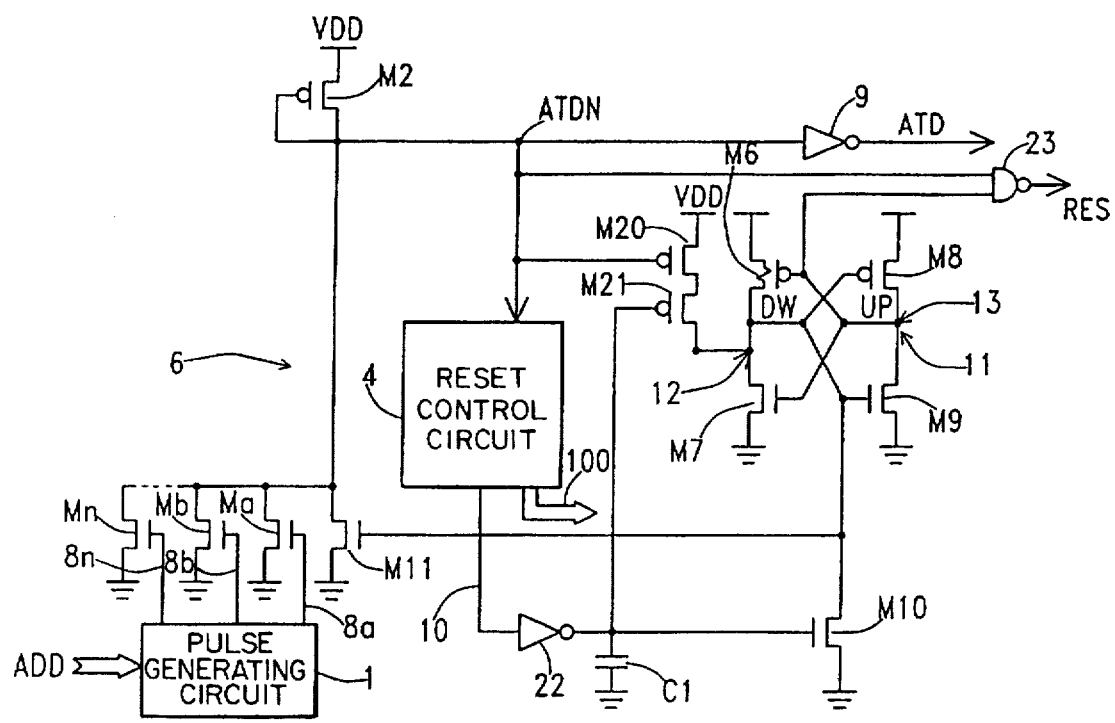
Figure 6:
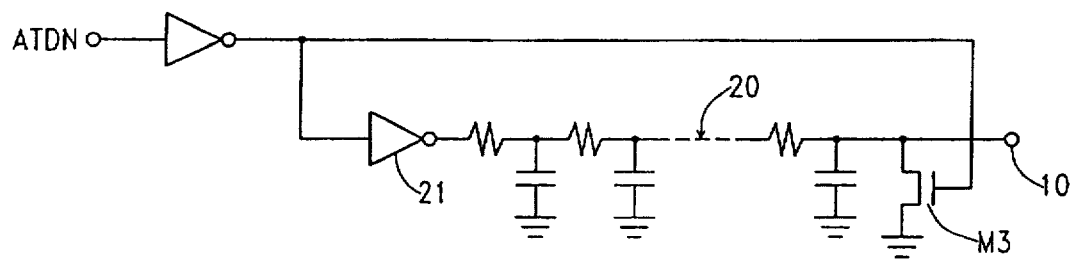
Figure 7:
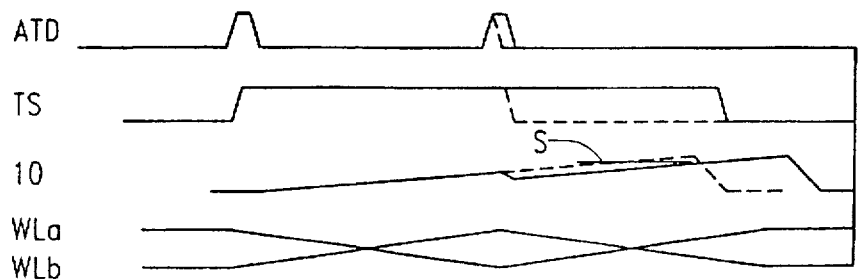
Figure 8:
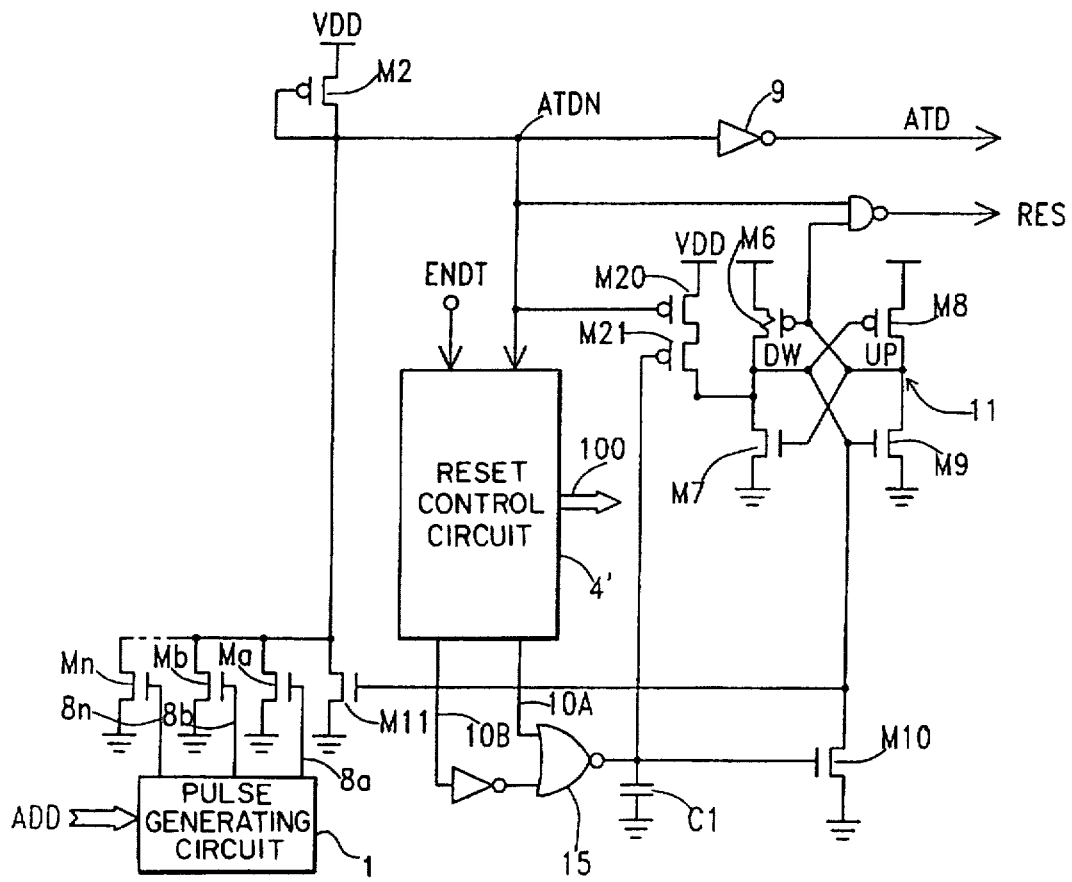
Figure 9:
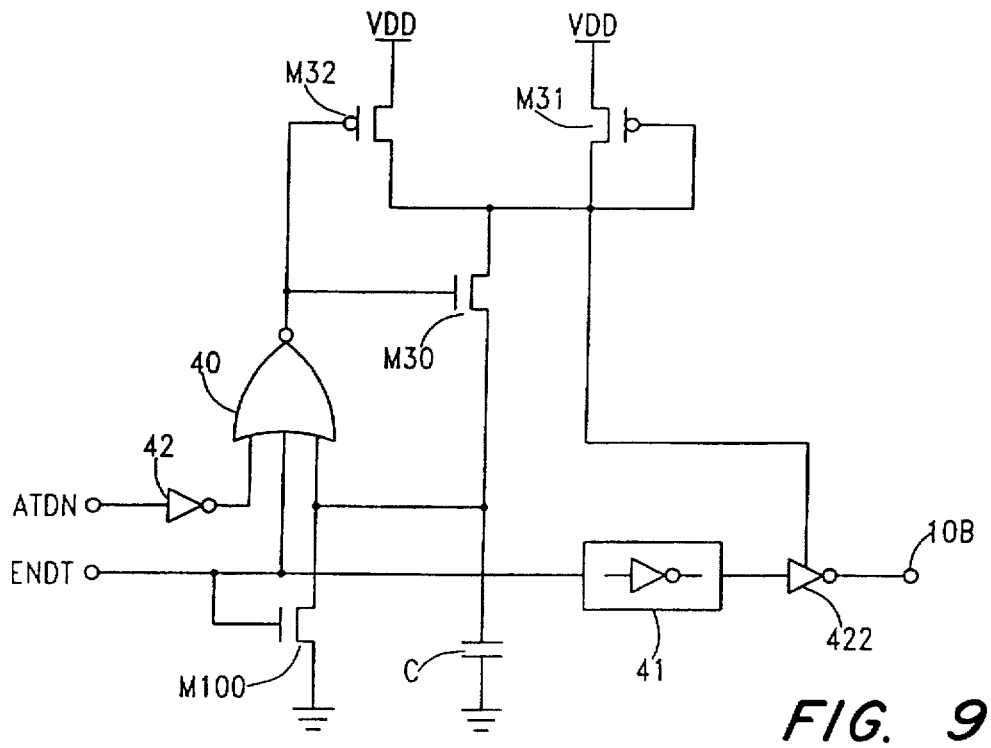

FIG. 4 schematically shows a circuit for generating timing signals for reading a memory device according to the present invention;

FIG. 5 is a diagram of a circuit according to a first embodiment of the present invention;

FIG. 6 shows in detail the structure of a block of the circuit of FIG. 5;

FIG. 7 is a timing diagram showing the operation of the circuit of FIG. 5, in the presence of noise;

FIG. 8 is a diagram of a circuit according to a second embodiment of the present invention, which is a variant of the embodiment of FIG. 5;

FIG. 9 shows in detail the structure of a block of the circuit of FIG. 8;

4

Figure 10:
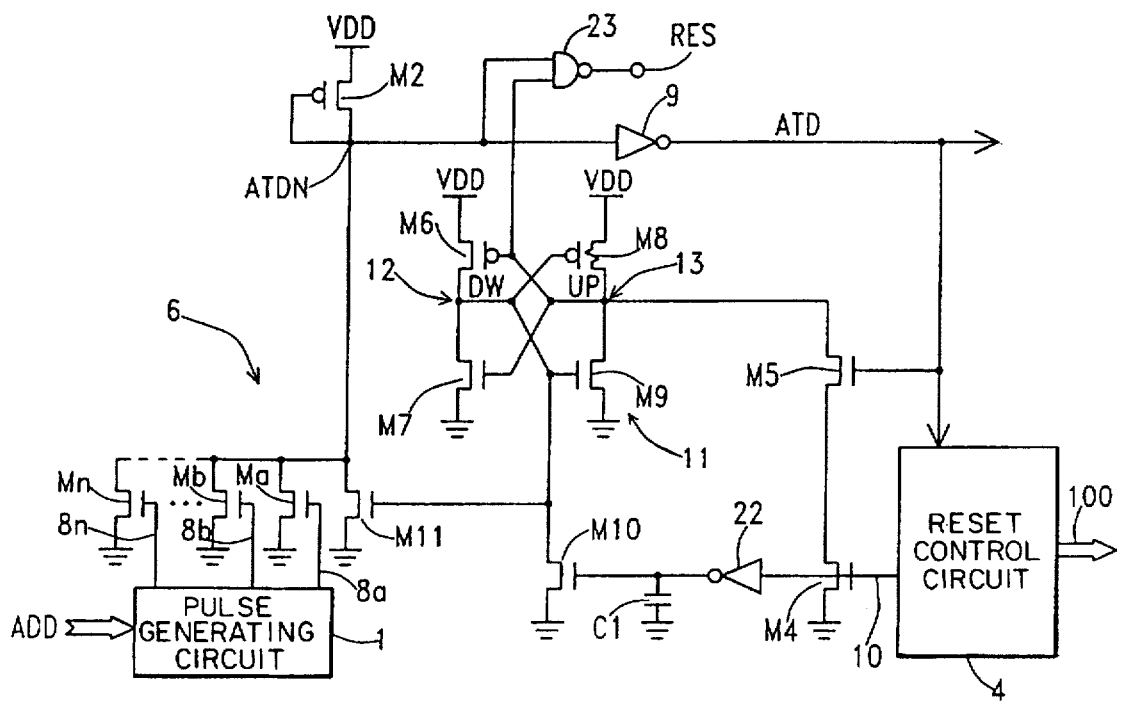
Figure 11:
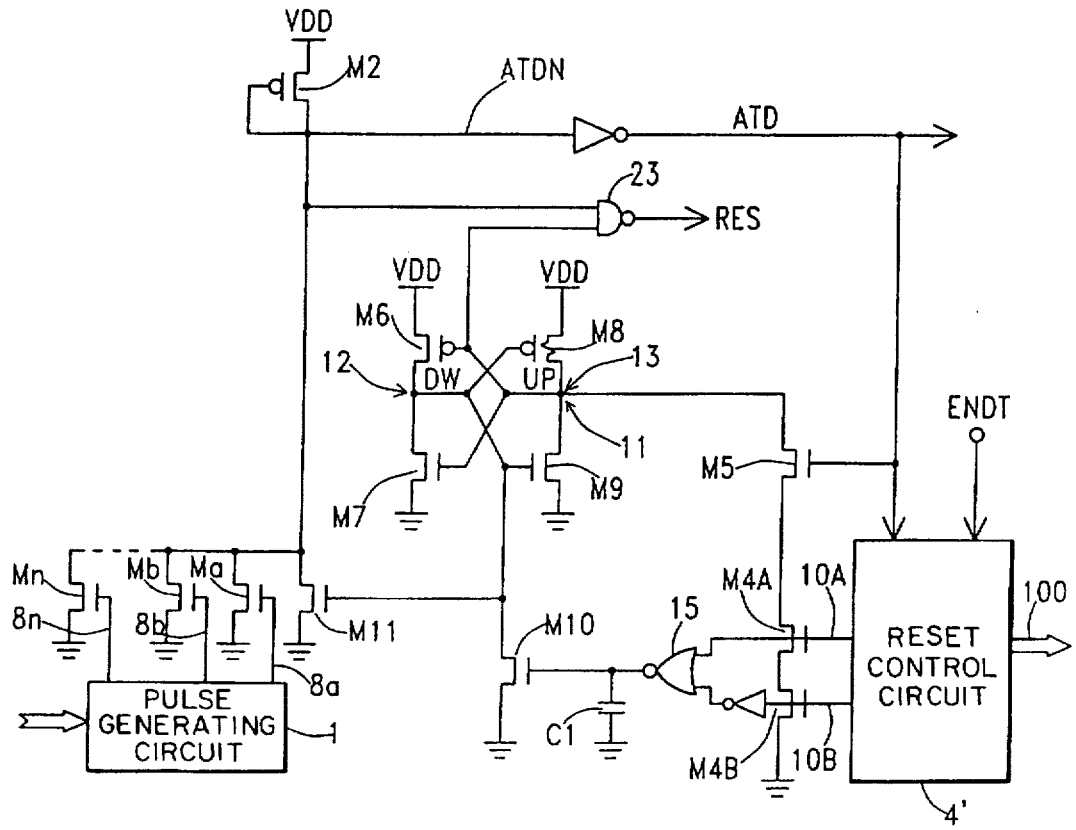

FIG. 10 is a diagram of a circuit according to a third embodiment of the present invention; and FIG. 11 is a diagram of a circuit according to a fourth embodiment of the present invention, which is a variant of the embodiment of FIG. 10.

DETAILED DESCRIPTION

Figure 1:
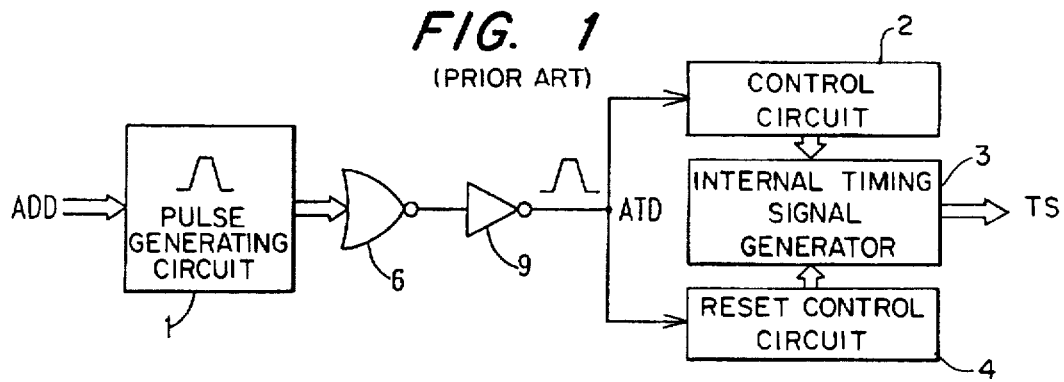
Figure 2:
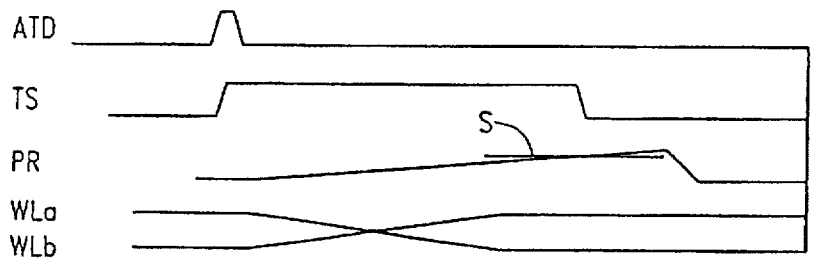
FIG. 2 is a timing diagram showing the operation of the circuit of FIG. 1, in the absence of noise.
Figure 3:
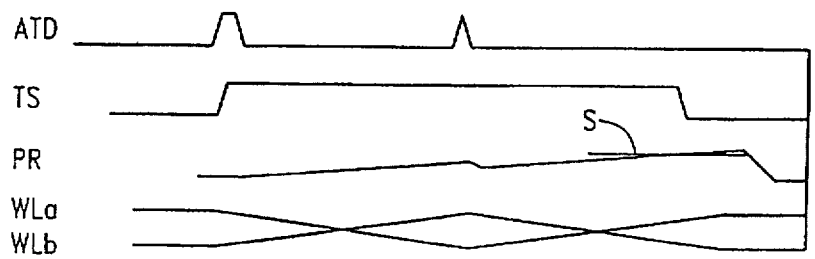
FIG. 3 is a timing diagram showing the operation of the circuit of FIG. 1 in the presence of noise.

With reference to the drawings, FIGS. 1, 2 and 3 refer to a conventional circuit for generating timing signals used for reading a memory device, and have already been described.

FIG. 4 schematically shows a circuit for generating timing signals for reading a memory device according to the present invention. Such a circuit is substantially similar to that of FIG. 1, comprising a block 1, supplied by address signals ADD, for generating individual pulse signals detecting a state change of a respective one of the address signals ADD, OR logic circuitry for generating a signal ATD (Address Transition Detection) starting from said individual pulse signals, a block 2 supplied by signal ATD for driving a block 3 generating timing signals TS for governing the read operation of the memory device, and a block 4 supplied by signal ATD for determining the reset of the timing signals TS. The circuit further comprises a feedback loop between block 4 and block 1. Such feedback loop comprises a circuit block 5 monitoring the operation of block 4 and, if malfunctioning is detected due to the fact that the ATD pulse driving block 4 does not have the prescribed duration, retroacts instantaneously on block 1 to determine a time extension of the anomalous ATD pulse. In other words, when an ATD pulse is generated having a normal width, the circuit of FIG. 4 works in exactly the same way as the circuit of FIG. 1. When differently, due to noise, an ATD pulse is produced having an insufficient width, which could only partially reset signal PR in FIG. 3, block 5 detects such a condition and drives block 1 in such a way as to determine an extension of the ATD pulse, so that signal PR can effectively be reset.

The schematic circuit of FIG. 4 can be practically implemented in several ways, some of which will be now described.

FIG. 5 shows a circuit according to a first practical embodiment of the present invention. The NOR gate 6 of the circuit shown in FIG. 4 comprises a load transistor M2 and a plurality of N-channel MOSFETs Ma–Mn connected in parallel to each other, each driven by a respective 8a–8n generated by block 1; block 1 is not shown in detail because it is well known to the skilled reader: it is in fact the group of circuits normally associated to the input buffers for the address signals ADD and generating logic pulses of prescribed duration whenever the respective address signal undergoes a change of logic state.

The output signal ATDN of NOR 6 supplies an inverter 9 whose output forms signal ATD, which is the logic complement of signal ATDN.

Signal ATDN supplies block 4, which in this embodiment comprises the circuit shown in FIG. 6, i.e., an RC ladder network 20 driven at its input by an inverting buffer 21 in turn supplied by the logic complement of signal ATDN. The output of the ladder network 20 forms the output 10 of block 4; at the output of the ladder network 20 there is also connected an N-channel MOSFET M3 with source connected to ground and driven by the logic complement of signal ATDN. The ladder network 20 simulates a row of the array of memory cells (not shown because per-se known), so that the propagation delay of signal ATDN along the ladder network 20 simulates the activation delay (selection) of any row of the array of memory cells. In practice, the ladder network 20 can be realized by means of a dummy row of memory cells, identical to the normal rows of the memory cell array.

The output 10 of block 4 is substantially a ramp signal, and supplies a CMOS inverter 22, designed to have a very low threshold, substantially equal to the threshold voltage of the N-channel MOSFET of the inverter itself. The output of inverter 22 drives an N-channel MOSFET M10 with source connected to ground and drain connected to an input node DW of a latch 11.

Block 4 has a bus of output signals 100 supplied to block 3 to reset the timing signals TS. Block 4 comprises a level detector circuit (not shown because per-se known) monitoring the level of the ramp signal 10; when the ramp signal 10 reaches the threshold level S (FIG. 2), the level detector circuit activates the reset signal of the bus 100.

Latch 11 comprises a first circuit branch 12 containing a P-channel MOSFET M6 and an N-channel MOSFET M7 serially connected between a voltage supply VDD and ground, and a second circuit branch 13 containing a P-channel MOSFET M8 and an N-channel MOSFET M9 serially connected between voltage VDD and ground. Node UP is the common node between M8 and M9, and is also connected to the gate of M6 and M7; similarly, node DW is the common node between M6 and M7 and is connected to the gates of M8 and M9. MOSFET M6 is realized in such a way as to have a higher output resistance than M8. Similarly, MOSFET M7 is fabricated in such a way as to have an output resistance sufficiently lower than an output resistance of MOSFET M9. In this way, latch 11 is naturally unbalanced, that is when it is powered it naturally sets in an equilibrium condition wherein node UP is at the high logic level and node DW is at the low logic level.

The drain of M10 further drives an N-channel MOSFET M11 connected in parallel to MOSFETs Ma–Mn.

Between node DW of latch 11 and the voltage VDD there are further connected in series two P-channel MOSFETs M20 and M21, the first controlled by signal ATDN and the second controlled by the output of inverter 22.

Node UP and signal ATDN are further supplied to a NAND gate 23, the output thereof forming a reset signal RES.

In normal operation, i.e., in the absence of noise on the voltage supply VDD and/or on the reference voltage (ground), when one of the address signals ADD changes its state the circuits of block 1 generate, on one of the signals 8a–8n, a logic pulse of value "1" having a prescribed duration, which turns the respective MOSFET Ma–Mn on. Signal ATDN is brought to ground for said prescribed time interval, and a logic pulse of value "1" is generated on signal ATD. As appears from FIG. 6, the transition to "0" of signal ATDN causes the reset of signal 10, because MOSFET M3 turns on and discharges the RC ladder 20. On the falling edge of signal ATD (i.e. on the rising edge of signal ATDN) the RC ladder 20 starts to discharge, and the ramp signal 10 is generated. When the ramp signal 10 reaches the threshold of CMOS inverter 22, which is very low and approximately equal to the threshold voltage of the N-channel MOSFET of the inverter 22, the latter switches turning MOSFET M10 off; M10 no longer forces MOSFET M11 in the off condition. However, because latch 11 is naturally unbalanced in such a way as node DW is at "0", M11 remains off and does not affect the duration of the pulse of signal ATD. Incidentally, it is to be observed that when inverter 22 switches, M21 turns on, but since M20 is off (ATDN is already returned to "1"), the voltage of node DW is not affected.

Additionally, the "0" logic pulse of signal ATDN causes the generation of a logic pulse on the reset signal RES.

Let us now suppose that, due to noise on the voltage supply VDD or ground, the signal ATD (and ATDN) that is generated does not have a duration sufficient to determine the reset of the ramp signal 10 and the generation of the pulse RES. Let us suppose that the situation shown in FIG. 7 takes place: after the generation of an ATD pulse of normal duration, during the rise of the ramp signal 10, a new ATDN pulse is generated (and correspondingly an ATD pulse), having however, a duration too short to be capable of completely discharging the ladder network 20 through M3 (as shown by dotted line in FIG. 7). Such a spurious ATD pulse starts the deselection of the row of the array previously addressed, and the selection of a new row of the memory array; thus, the spurious ATD pulse starts a new read operation of the memory device. However, if the ramp signal 10 has already trespassed the threshold of inverter 22 (which is very low, much lower than the threshold voltage S), M10 is off, so that the conduction state of M11 depends on the state memorized in the latch 11. As already mentioned, latch 11 is normally in the state UP="1" and DW="0", so that M11 is off; however, if the spurious ATDN pulse has a duration at least sufficient to cause M20 to turn on, node DW of latch 11 is forcedly brought to "1" and node UP is forcedly brought to "0". M11 is thus turned on, so as to extend the duration of ATDN pulse. The amount of the such an extension is determined by the fact that signal ATDN also resets the ramp signal 10: when signal 10 is returned below the threshold of inverter 22, after a delay introduced by the RC time constant of capacitor C1 and the output resistance of the P-channel MOSFET of CMOS inverter 22, M10 is turned on again so as to forcedly turn M11 off.

In other words, the circuit of FIG. 5 detects the generation of a spurious ATD pulse, even of duration not sufficient to reset the ramp signal 10, and extends the duration thereof by an amount sufficient to guarantee that the starting conditions in block 4 are achieved. In this way, it is guaranteed that the timing signals TS are properly reset after a time interval, measured from the generation of the spurious ATD pulse, sufficient to guarantee that the new row has been selected.

FIG. 8 shows a circuit according to a second embodiment of the present invention. This circuit is substantially a variant of the circuit of FIG. 5, the difference being that block 4 has been substituted by a block 4' simulating not only the activation delay of a row of the memory cell array (by means of the ladder network of FIG. 6 generating the ramp signal 10), but also the activation delay of a column of memory cells. Block 4' has thus two output signals, 10A and 10B: signal 10A corresponds to ramp signal 10 of the circuit of FIG. 5, while signal 10B is a signal with a substantially exponential shape reproducing the charging of a column of memory cells when such column is selected.

Block 4' in FIG. 8 comprises, in addition to the circuit shown in FIG. 6 for the generation of the ramp signal 10A, the circuit shown in FIG. 9 for the generation of signal 10B. Such a circuit comprises a capacitor C reproducing the capacitance of a column of memory cells (such a capacitance can, in practice, be realized by means of a dummy column of memory cells identical to the column of memory cells of the memory array), a circuit for regulating the voltage at which the capacitor is charged comprising an N-channel MOSFET M30 (typically having a low threshold voltage) controlled by the output of a NOR gate 40 having an input connected to the source of MOSFET M30, said circuit reproducing the circuit for regulating the drain voltage of the memory cells normally provided in the sensing circuits of the memory cell array, a diode-connected P-channel MOSFET M31 and a P-channel MOSFET M32 driven by gate 40 acting as a load for condenser C. The NOR gate 40 is further supplied, through an inverter 42, by signal ATDN and by a timing signal ENDT, for example, belonging to the bus of timing signals TS, which also supplies a delay line 41 which simulates the selection path of a generic column of the memory array. Signal ENDT further controls an N-channel MOSFET M100 connected in parallel to capacitance C to cause the discharge thereof. The drain of M31 also acts as a voltage supply for an inverting drive circuit 422, receiving at its input the output of the delay line 41 and the output thereof forms signal 10B.

Signal 10B is activated when the transition of signal ENDT has propagated through the delay line 41 and capacitance C has charged to the voltage fixed by the voltage regulating circuit. Only at this time the drain of M31 has increased in voltage to a value substantially equal to VDD, providing a voltage supply to the drive circuit 422. Before the activation of signal ENDT, MOSFET M100 is kept on, so as to discharge capacitance C.

Coming back to FIG. 8, signal 10A and a logic complement of signal 10B are supplied to a NOR gate 15; NOR gate 15 is a CMOS NOR gate and, similarly to CMOS inverter 22 in FIG. 5, is realized in such a way as have a very low threshold voltage. The output of NOR gate 15, loaded by capacitance C1, drives MOSFET M10 in a way similar to inverter 14 in FIG. 5.

The circuit of FIG. 8 behaves in the same way as the circuit of FIG. 4, with the only difference that MOSFET M10 is turned off as soon as one of signals 10A, 10B reaches the threshold voltage of NOR gate 15.

FIG. 10 shows a circuit according to a third embodiment of the invention. The circuit is substantially similar to that shown in FIG. 5, and comprises a block 4 generating a ramp signal 10. However, differently from the circuit of FIG. 5, signal 10 drives an N-channel MOSFET M4 with source connected to ground and connected in series to an N-channel MOSFET M5 with its drain connected to node UP of latch 11. Signal 10 also drives, as in the circuit of FIG. 5, a CMOS inverter 22 with very low threshold; i.e., P-channel MOSFETs M20 and M21 of the circuit of FIG. 5, connected between VDD and node DW of latch 11, have been replaced by the N-channel MOSFETs M4 and M5 connected between node UP of latch 11 and ground.

The operation of the circuit of FIG. 10 is identical to that of the circuit of FIG. 5: when ramp signal 10 reaches the threshold of MOSFET M4, corresponding substantially to the threshold of inverter 22, MOSFET M10 is turned off, so that MOSFET M11 can be controlled by node DW of latch 11. If, after ramp signal 10 has trespassed the threshold of MOSFET M4, a spurious ATD pulse is produced, since the path towards ground formed by MOSFETs M4 and M5 is enabled, node UP of latch 11, normally at the high level, is forcedly brought to ground, and consequently node DW is brought to the high level, turning MOSFET M1 on and causing the desired time extension of the ATD pulse.

In FIG. 11 it is shown a circuit according to a fourth embodiment of the invention, which forms a variant of the circuit of FIG. 10. The block 4 is substituted by the block 4', generating the ramp signal 10A and the substantially exponential signal 10B as in the case of the circuit of FIG. 8. Connected in series to MOSFET M5 is a MOSFET M4A, driven by ramp signal 10A, and a MOSFET M4b, driven by signal 10B. Signal 10A supplies a first input of a NOR gate 15, whose second input is supplied by the output of an inverter supplied by signal 10B.

The operation of this circuit is completely similar to that of the previous embodiments.

I claim:

1. A circuit for generating and resetting timing signals used for reading a memory device, comprising first detecting circuit means for detecting a state transition of at least one address digital signal of the memory device, said detecting circuit means for generating a start read operation digital signal pulse upon the state transition of at least one of said address digital signals representing a start of a memory read operation, second circuit means activated by said start read operation digital signal pulse for generating timing signals for the read operation of the memory device, third circuit means driven by said start read operation digital signal pulse for generating resetting signals for said timing signals, and fourth circuit means for detecting when said start read operation digital signal has a duration shorter than a prescribed duration and for consequently causing the first detecting means to extend of the duration of said start read operation digital signal pulse sufficient to assure correct generation of said resetting signals only when said start read operation digital signal pulse occurs prior to an end of a previous memory read operation.

2. The circuit according to claim 1, wherein said first detecting circuit means comprise a plurality of circuits each associated with a respective address signal for generating, when said at least one address digital signal changes its state, at least one pulse digital signal, and a boolean summing circuit supplied with said at least one pulse digital signal for generating, when said at least one pulse digital signal is produced, said start read operation digital signal.

3. The circuit according to claim 1, wherein said third circuit means comprise a circuit for generating a ramp signal reproducing an activation delay of a row of memory cells of a memory cell array of the memory device, said ramp signal being activated by said start read operation digital signal, and first level detecting means that, when said ramp signal reaches a first prescribed threshold level, generates a reset signal for said timing signals.

4. The circuit according to claim 3, wherein said fourth circuit means comprise a set-reset bistable circuit having an output supplying an input of said boolean summing circuit, and a drive circuit of the bistable circuit for enabling a setting of the bistable circuit by said start read operation digital signal, when said ramp signal has reached a second prescribed threshold level which is reached before said first threshold level, in a state in which the output of the bistable circuit controls the boolean summing circuit to keep said start read operation digital signal activated, so that when after the generation of said start read operation digital signal and before said read operation is terminated a new start read operation digital signal is generated, wherein the latter is kept forcedly activated for a time sufficiently long to assure the reset of said ramp signal.

5. The circuit according to claim 4, wherein said set-reset bistable circuit comprises a latch having a preferred equilibrium state in which said output has a logic value such as not to affect the boolean summing circuit.

6. The circuit according to claim 5, wherein said fourth circuit means comprise second level detecting means supplied with said ramp signal suitable to detect a reaching of said second threshold value and which consequently controls deactivation of forcing circuit means of the logic state of the output of the set-reset bistable circuit, so that control of the input of the boolean summing circuit by the bistable circuit is allowed only after the ramp signal has reached the second threshold value.

7. The circuit according to claim 6, wherein said second level detecting means introduce a time delay between the reset of said ramp signal by the start read operation digital signal and the activation of said forcing circuit means which forces the output of the set-reset bistable circuit in said preferred equilibrium state while not affecting a state of the boolean summing circuit.

8. The circuit according to claim 7, wherein said third circuit means comprise a circuit for generating a second signal capable of reproducing an activation delay of a column of memory cells of the memory cell array.

9. The circuit according to claim 8, wherein said third circuit means supplies said second signal supplies together with said ramp signal, to said second level detecting circuit means.

10. The circuit according to claim 9, wherein said second level detecting circuit means controls deactivation of said forcing means in consequence to a reaching of said second threshold level by at least one of said ramp signal and said second signal, and deactivation of the forcing means in consequence of the resetting of both said ramp signal and said second signal.

11. An apparatus for generating and resetting timing signals used for reading a memory device, the apparatus comprising:
  a first circuit to generate a start read operation digital signal pulse representing a start of a memory read operation of the memory device; and
  a second circuit, coupled to the first circuit, to determine a duration of said start read operation digital signal pulse and to determine when said digital signal pulse occurs relative to an end of a previous memory read operation, the second circuit to cause the first circuit to extend the duration of said start read operation digital signal pulse in response to detecting said start read operation digital signal pulse having a duration shorter than a predetermined duration and occurring prior to the end of the previous memory read operation.

12. The apparatus as recited in claim 11, wherein the first circuit comprises:
  a detection circuit to detect when at least one address signal of a plurality of address signals of the memory device has changed its state.

13. An apparatus for compensating for a spurious signal in a memory device including at least one address signal, the apparatus comprising:
  a first circuit to generate a first pulse signal when the at least one address signal of the memory device has changed its state; and
  a second circuit to determine a pulse width of the first pulse signal and to determine when the first pulse signal occurs relative to an end of a previous memory read operation,
  wherein, in response to determining the pulse width to be less than a predetermined pulse width and occurring prior to the end of the previous memory read operation, the second circuit causing the first circuit to lengthen the pulse width of the first pulse signal to be at least the predetermined pulse width.

14. The apparatus as recited in claim 13, wherein the first circuit comprises
  first plurality of N-channel MOSFETs connected in parallel to one another, each having a source connected to ground and each having a gate coupled to a respective address signal;
  an additional N-channel MOSFET connected in parallel with the first plurality of N-channel MOSFETs; channel MOSFETs;
  a load transistor connected between a first reference voltage level and the commonly connected drains of the first plurality of N-channel MOSFETs at a first node; and
  the third circuit comprises:
    a CMOS inverter having a first threshold level and an input coupled to receive the first ramp signal;
    a capacitor connected between an output of the CMOS inverter and ground;
    an N-channel MOSFET having a gate connected to the output of the CMOS inverter, a source connected to ground and a drain connected to a gate of the additional N-channel MOSFET;
    an unbalanced latch circuit having a first input node connected to the drain of the N-channel MOSFET; and
    first and second P-channel MOSFETs connected in series between the first reference voltage level and the first input node, a gate of the first P-channel MOSFET connected to the inverted first pulse signal and a gate of the second P-channel MOSFET connected to the output of the CMOS inverter.

15. The apparatus as recited in claim 14, wherein the unbalanced latch circuit comprises:
  a first circuit branch including a first branch P-channel MOSFET and a first branch N-channel MOSFET serially connected between the first reference voltage level and ground;
  a second circuit branch including a second branch P-channel MOSFET and a second branch N-channel MOSFET serially connected between the first reference voltage level and ground;
  wherein the first input node is a common node between the first branch P-channel MOSFET and the first branch N-channel MOSFET;
  wherein a first output node is a common node between the second branch P-channel MOSFET and the second branch N-channel MOSFET;
  wherein the first branch P-channel MOSFET has an output resistance higher than an output resistance of the second branch P-channel MOSFET and the first branch N-channel MOSFET has an output resistance lower than an output resistance of the second branch N-channel MOSFET so that when the unbalanced latch is powered it naturally sets in an equilibrium condition wherein the output node is at a first logic level and the input node is at a second logic level; and
  wherein a gate of the first branch P-channel MOSFET is-connected to the first output node and to a gate of the first branch N-channel MOSFET; and
  wherein a gate of the second branch P-channel MOSFET is connected to the first input node and to the gate of the second branch N-channel MOSFET.

16. The apparatus as recited in claim 13, wherein the first circuit comprises:
  a first plurality of N-channel MOSFETs connected in parallel to one another, each having a source connected to ground and each having a gate coupled to a respective address signal;
  an additional N-channel MOSFET connected in parallel with the first plurality of N-channel MOSFETs; and
  a load transistor connected between a first reference level and the drains of the first plurality of N-channel MOSFETs at a first node; and
  the third circuit comprises:

a CMOS inverter having a first threshold level and an input coupled to receive the first ramp signal;

a capacitor connected between an output of the CMOS inverter and ground;

an N-channel MOSFET having a gate connected to the output of the CMOS inverter, a source connected to ground and a drain connected to a gate of the additional N-channel MOSFET;

an unbalanced latch circuit having a first input node connected to the drain of the N-channel MOSFET; and first and second series N-channel MOSFETs connected in series, with a drain of the first series N-channel MOSFET connected to a second input node of the unbalanced latch circuit, a source of the first series N-channel MOSFET connected to a drain of the second series N-channel MOSFET, a source of the second series N-channel MOSFET connected to ground, a gate of the first series N-channel MOSFET to receive the first pulse signal and a gate of the second series N-channel MOSFET to receive the first ramp signal.

17. The apparatus as recited in claim 16, wherein the unbalanced latch circuit comprises:

a first circuit branch including a first branch P-channel MOSFET and a first branch N-channel MOSFFT serially connected between the first reference voltage level and ground;

a second circuit branch including a second branch P-channel MOSFET and a second branch N-channel MOSFET serially connected between the first reference voltage level and ground;

wherein the first input node is a common node between the first branch P-channel MOSFET and the first branch N-channel MOSFET;

wherein a first output node) is a common node between the second branch P-channel MOSFET and the second branch N-channel MOSFET;

wherein the first branch P-channel MOSFET has an output resistance higher than an output resistance of the second branch P-channel MOSFET and the first branch N-channel MOSFET has an output resistance lower than an output resistance of the second branch N-channel MOSFET so that when the unbalanced latch is powered it naturally sets in an equilibrium condition wherein the output node is at a first logic level and the input node is at a second logic level;

wherein a gate of the first branch P-channel MOSFET is connected to the first output node and to a gate of the first branch N-channel MOSFET; and wherein a gate of the second branch P-channel MOSFET is connected to the first input node and to the gate of the second branch N-channel MOSFET.

18. The apparatus as recited in claim 14, wherein the second circuit comprises:

a first inverter having an input to receive the inverted first pulse signal;

a second inverter having an input connected to an output of the first inverter;

an RC ladder circuit having an input connected to an output of the second inverter; and an N-channel MOSFET having a gate connected to the output of the first inverter, a first terminal connected to an output of the RC ladder and a second terminal connected to ground;

wherein the first ramp signal is generated at the output of the RC ladder circuit.

19. An apparatus for adjusting a pulse transition signal on a first node in a memory device, the memory device including first ramp generating circuitry to generate a first ramp signal on a second node in response to the pulse transition signal on the first node, the adjusting apparatus comprising:

a switching device coupled to the first node and to a first reference lead; and a control circuit coupled to the first node, the second node and to a control terminal of the switching device, the control circuit to detect a pulse width of the pulse transition signal and to determine when the pulse transition signal has occurred relative to an end of a previous memory read operation, wherein, in response to determining that the detected pulse width is less than a first time duration and the pulse transition signal has occurred prior to the end of the previous memory read operation, the control circuit to operate the switching device so as to lengthen the pulse width of the pulse transition signal to be at least equal to the first time duration.

20. The apparatus as recited in claim 19, wherein the switching device is an N-channel MOSFET connected between the first node and the first reference lead.

21. The apparatus as recited in claim 19, wherein the control circuit comprises:

a CMOS inverter having a first threshold level and an input coupled to the second node;

a capacitor connected between an output of the CMOS inverter and ground;

an N-channel MOSFET having a gate connected to the output of the CMOS inverter, a source connected to the first reference lead and a drain connected to the control terminal of the switching device;

an unbalanced latch circuit having a first input node connected to the drain of the N-channel MOSFET; and first and second P-channel MOSFETs connected in series between a supply voltage lead and a the first input node, a gate of the first P-channel MOSFET connected to the first node and a gate of the second P-channel MOSFET connected to the output of the CMOS inverter.

22. The apparatus as recited in claim 21, wherein the unbalanced latch circuit comprises:

first circuit branch including a first branch P-channel MOSFET and a first branch N-channel MOSFET serially connected between the supply voltage lead and ground;

a second circuit branch including a second branch P-channel MOSFET and a second branch N-channel MOSFET serially connected between the supply voltage lead and ground;

wherein the first input node is a common node between the first branch P-channel MOSFET and the first branch N-channel MOSFET;

wherein a first output node) is a common node between the second branch P-channel MOSFET and the second branch N-channel MOSFET;

wherein the first branch P-channel MOSFET has an output resistance higher than an output resistance of the second branch P-channel MOSFET and the first branch N-channel MOSFET has an output resistance lower than an output resistance of the second branch N-channel MOSFET so that when the unbalanced latch is powered it naturally sets in an equilibrium condition wherein the output node is at a first logic level and the input node is at a second logic level;

wherein a gate of the first branch P-channel MOSFET is connected to the first output node and to a gate of the first branch N-channel MOSFET; and wherein a gate of the second branch P-channel MOSFET is connected to the first input node and to the gate of the second branch N-channel MOSFET.

23. The apparatus as recited in claim 19, wherein the memory device includes second ramp signal generating circuitry to generate a second ramp signal on a third node, wherein the control circuit comprises:

a CMOS inverter having a first threshold level and an input coupled to the second node;

a CMOS NOR gate having the first threshold level with a first input coupled to the third node and a second input coupled to an output of the CMOS inverter;

a capacitor connected between an output of the CMOS NOR gate and the first reference lead;

an N-channel MOSFET having a gate connected to an output of the CMOS NOR gate, a source connected to the first reference lead and a drain connected to the control terminal of the switching device;

an unbalanced latch circuit having a first input node connected to the drain of the N-channel MOSFET; and first and second P-channel MOSFETs connected in series between a supply voltage lead and the first input node, a gate of the first P-channel MOSFET connected to the first node and a gate of the second P-channel MOSFET connected to the output of the CMOS invertor.

24. The apparatus as recited in claim 23, wherein the unbalanced latch circuit comprises:

a first circuit branch including a first branch P-channel MOSFET and a first branch N-channel MOSFET serially connected between the supply voltage lead and ground;

a second circuit branch including a second branch P-channel MOSFET and a second branch N-channel MOSFET serially connected between the supply voltage lead and ground;

wherein the first input node is a common node between the first branch P-channel MOSFET and the first branch N-channel MOSFET;

wherein a first output node is a common node between the second branch P-channel MOSFET and the second branch N-channel MOSFET;

wherein the first branch P-channel MOSFET has an output resistance higher than an output resistance of the second branch P-channel MOSFET and the first branch N-channel MOSFET has an output resistance lower than an output resistance of the second branch N-channel MOSFET so that when the unbalanced latch is powered it naturally sets in an equilibrium condition wherein the output node is at a first logic level and the input node is at a second logic level;

wherein a gate of the first branch P-channel MOSFET is connected to the first output node and to a gate of the first branch N-channel MOSFET; and wherein a gate of the second branch P-channel MOSFET is connected to the first input node and to the gate of the second branch N-channel MOSFET.

25. A method of adjusting a pulse width of a pulse signal on a first node in a memory device, the memory device including first ramp signal generating circuitry to generate a first ramp signal on a first ramp signal node in response to the pulse signal, the method including steps of:

detecting a pulse width of the pulse signal on the first node;

detecting the first ramp signal on the first ramp signal node;

detecting when the pulse signal occurs relative to the first ramp signal, and adjusting the pulse width of the pulse signal to be a predetermined time duration when the detected pulse width is less than the predetermined time duration and the pulse signal has occurred prior to the first ramp signal reaching a first threshold level wherein the first threshold level represents an end of a memory read operation of the memory device.

26. The method as recited in claim 25, wherein the adjusting step includes steps of:

coupling a switching device to the first node and to ground;

coupling an input lead of a CMOS inverter to the first ramp signal node;

coupling an output of the CMOS inverter to ground through a capacitor;

coupling a gate of an N-channel MOSFET to the output of the CMOS inverter, a source of the N-channel MOSFET to ground and a drain to a control terminal of the switching device; and coupling an unbalanced latch circuit to the first node, the output of the CMOS inverter and the drain of the N-channel MOSFET.

27. A method of generating and resetting timing signals used for reading a memory device, the method comprising steps of:

(a) generating a start read operation digital signal pulse representing a start of a memory read operation of the memory device;

(b) detecting a duration of said start read operation digital signal pulse;

(c) detecting when said start read operation digital signal pulse occurs relative to an end of a previous memory read operation; and (d) in response to detecting the duration of the digital signal pulse to be less than a predetermined duration and occurring prior to the end of the previous memory read operation, extending the duration of said start read operation digital signal pulse to be at least the predetermined duration.

28. The method as recited in claim 27, further comprising steps of:

(d) generating a read operation ramp signal at the start of the memory read operation.

29. The method as recited in claim 27, wherein step (c) comprises a step of:

determining whether a read operation ramp signal associated with the previous memory read operation has reached a predetermined threshold.

* * * * *